United States Patent
Li et al.

(10) Patent No.: US 8,067,890 B2
(45) Date of Patent: Nov. 29, 2011

(54) ORGANIC ELECTROLUMINESCENCE STRUCTURE HAVING A HEIGHT DIFFERENCE BETWEEN SURFACES OF A CONTROL DEVICE AND AN ORGANIC ELECTROLUMINESCENCE DEVICE

(75) Inventors: Hsing-Chuan Li, Taoyuan (TW);
Chung-Chun Lee, Yunlin County (TW);
Min-Chieh Hu, Tainan County (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 12/785,905

(22) Filed: May 24, 2010

(65) Prior Publication Data
US 2010/0231489 A1 Sep. 16, 2010

Related U.S. Application Data

(63) Continuation of application No. 11/581,726, filed on Oct. 16, 2006, now Pat. No. 7,777,410.

(30) Foreign Application Priority Data

Jun. 15, 2006 (TW) .............................. 95121486 A

(51) Int. Cl.
*H05B 33/00* (2006.01)
*H05B 33/02* (2006.01)
(52) U.S. Cl. ........ 313/506; 313/504; 313/509; 313/512; 257/40; 257/79
(58) Field of Classification Search ........................ None
See application file for complete search history.

(56) References Cited

U.S. PATENT DOCUMENTS

| | | |
|---|---|---|
| 2002/0158568 A1 | 10/2002 | Satake |
| 2004/0041518 A1 | 3/2004 | Yoneda |
| 2004/0188692 A1 | 9/2004 | Ishikawa |
| 2004/0224456 A1 | 11/2004 | Abe |
| 2005/0012091 A1 | 1/2005 | Huang |
| 2005/0145861 A1 | 7/2005 | Kawakami et al. |
| 2005/0153468 A1 | 7/2005 | Gupta et al. |
| 2006/0035397 A1 | 2/2006 | Kim |
| 2007/0290606 A1 | 12/2007 | Li et al. |

FOREIGN PATENT DOCUMENTS

CN 1435894 8/2003
(Continued)

OTHER PUBLICATIONS

China Office Action dated Mar. 21, 2008 (8 pages).

(Continued)

*Primary Examiner* — Sikha Roy
(74) *Attorney, Agent, or Firm* — Holland & knight LLP; Brian J. Colandreo, Esq.; Mark H. Whittenberger, Esq.

(57) ABSTRACT

An organic electroluminescence structure comprises a first substrate, an organic electroluminescence device, and a control device. Forming either a lifting layer under the control device or a recess under the organic electroluminescence device, or forming both of them, creates a difference between their tops, in order to reduce the dark spots and promote the yield of the end product. The lifting layer preferably has a thickness greater than about 0.5 micro meters and the recess has a depth ranges of about 0.1 micro meters to about 100 micro meters. Alternatively, the height difference between the upper surfaces of the control device and the organic electroluminescence device is controlled to be greater than about 2 micro meters or substantially equal to 2 micro meters.

29 Claims, 6 Drawing Sheets

FOREIGN PATENT DOCUMENTS

| | | |
|---|---|---|
| CN | 095121486 | 6/2006 |
| JP | 2006-154494 | 8/2010 |
| TW | 1225317 | 12/2004 |

OTHER PUBLICATIONS

Taiwan Office Action dated Apr. 10, 1997 (4 pages).

China Office Action dated Nov. 23, 2007 (5 pages).

ORGANIC ELECTROLUMINESCENCE STRUCTURE HAVING A HEIGHT DIFFERENCE BETWEEN SURFACES OF A CONTROL DEVICE AND AN ORGANIC ELECTROLUMINESCENCE DEVICE

CROSS-REFERENCE TO RELATED APPLICATIONS

This application is a continuation of and claims priority to U.S. patent application Ser. No. 11/581,726, filed 16 Oct. 2006, now U.S. Pat. No. 7,777,410, the entire contents of which are incorporated herein by reference, which also claims the benefit of Taiwan Patent Application No. 095121486, filed Jun. 15, 2006, the contents of which are herein incorporated by reference in its entirety.

BACKGROUND OF THE INVENTION

1. Field of the Invention

The present invention relates to an organic electroluminescence structure, more particularly, to the organic electroluminescence structure which may reduce or eliminate dark spots occurring thereon.

2. Descriptions of the Related Art

The basic structure of an organic electroluminescence device (OELD) is schematically shown in FIG. 1. The OLED structure comprises a plurality of signal lines formed on a substrate. Commonly, the signal lines are constituted by a plurality of scan lines 15 and data lines 17, thereby defining a plurality of pixel areas 10 on the substrate. Each of the pixel areas 10 has a thin-film-transistor (TFT) and an OELD 13 disposed thereon. The scan lines 15 and the data lines 17 are utilized to control the image display of the pixel areas 10.

In comparison with liquid crystal displays (LCDs), an OELD display is capable of self-luminescence, and can perform higher contrast, and a wider viewing angle. The OLED is more compact in size and light in weight. It also performs a shorter response time. All of these advantages are brought from the structure without backlight module. On current trends, the OELD is going to be the most potential key technology in the field of the display.

However, OELD displays may encounter problems due to the failures in its manufacturing processes. For example, because the first and second substrates (usually named "a cover substrate") are disposed very close to each other, they may bend to be in contact with each other due to external forces or self-weights during manufacturing processes. Once there are particles existing between the substrates, the aforementioned contact is more likely to damage the OELD layer. The luminescence structure of the pixel areas would tend to be damaged, whereby occurring dark spots on the product.

FIG. 2 is a cross-sectional view illustrating the pixel area 10 between the first substrate 21 and the second substrate 23. Apparently, the pixel area 10 comprises a non-luminescence portion (i.e. where the TFT and the control device are located) and a luminescence portion (i.e. light penetrable area), wherein the non-luminescence portion is formed with a height relevant to the luminescence portion. When an impurities or a particle 25 is attached onto the upper surface of the non-luminescence portion, it is very possible that the second substrate 23 exerts a force to the particle 25 and produces stresses onto an OELD layer 24. If the stresses transit down to the luminescence portion, the OELD 13 at the luminescence portion would likely be damaged. The flaw as presented for the luminescence function is usually called a "dark spot."

In convention, increasing the thickness of each layer on the non-luminescence portion that results in the TFT 11 having a greater height is considered. The greater height of the TFT 11 may acquire a delay of the damage to the OELD layer 24. However, it would give rise to altering numerous manufacturing processes, influencing the yields, and increasing manufacturing costs. The way is not preferably exercised in the industry.

Given the above, providing an organic electroluminescence structure for promoting yields and reliabilities of products needs to be developed in this field.

SUMMARY OF THE INVENTION

The primary objective of the present invention is to provide an organic electroluminescence structure which can effectively eliminate or reduce dark spots. The present invention is to increase the height difference between upper surfaces of the control device and the organic electroluminescence device, in order to relieve the destructive stresses transiting from the non-luminescence portion to the luminescence portion, and therefore reduce the probability of failure on the organic electroluminescence device on the luminescence portion.

Another objective of the present invention is to provide an organic electroluminescence structure. Through the aforesaid arrangements, damages from particles, which are compressed by a mask, to break the organic electroluminescence device in an evaporation process can be reduced. After an encapsulation process, the similar damages caused by the desiccant layer which is disposed on the cover can also be reduced.

To achieve the aforementioned objectives, the organic electroluminescence structure of the present invention comprises a first substrate, an organic electroluminescence device, and at least one control device. The first substrate has a plurality of pixel areas, and each pixel area includes a luminescence portion and a non-luminescence portion adjacent to the luminescence portion. The organic electroluminescence device is disposed on the luminescence portion while the control device is disposed on the non-luminescence portion and electrically connects with the organic electroluminescence device. Each of the organic electroluminescence device and the control device respectively has an upper surface. Particularly, the height difference formed between the upper surfaces is greater than or equal to about 2 micro meters.

The organic electroluminescence structure of the present invention can also comprise a lifting layer formed on the non-luminescence portion. The lifting layer has a thickness greater than about 0.5 micro meters.

The organic electroluminescence structure of the present invention can also comprise a recess formed on the luminescence portion. The recess has a surface and the non-luminescence portion defines an upper surface as well. The upper surface of the recess and the upper surface of the non-luminescence portion form a height difference of about 0.1 micro meters to about 100 micro meters.

Other objectives, features, and advantages of the present invention will become apparent from the following detailed description of the preferred but non-limiting embodiments. The following description is made with reference to the accompanying drawings.

DESCRIPTION OF THE PREFERRED EMBODIMENT

Figure 3:
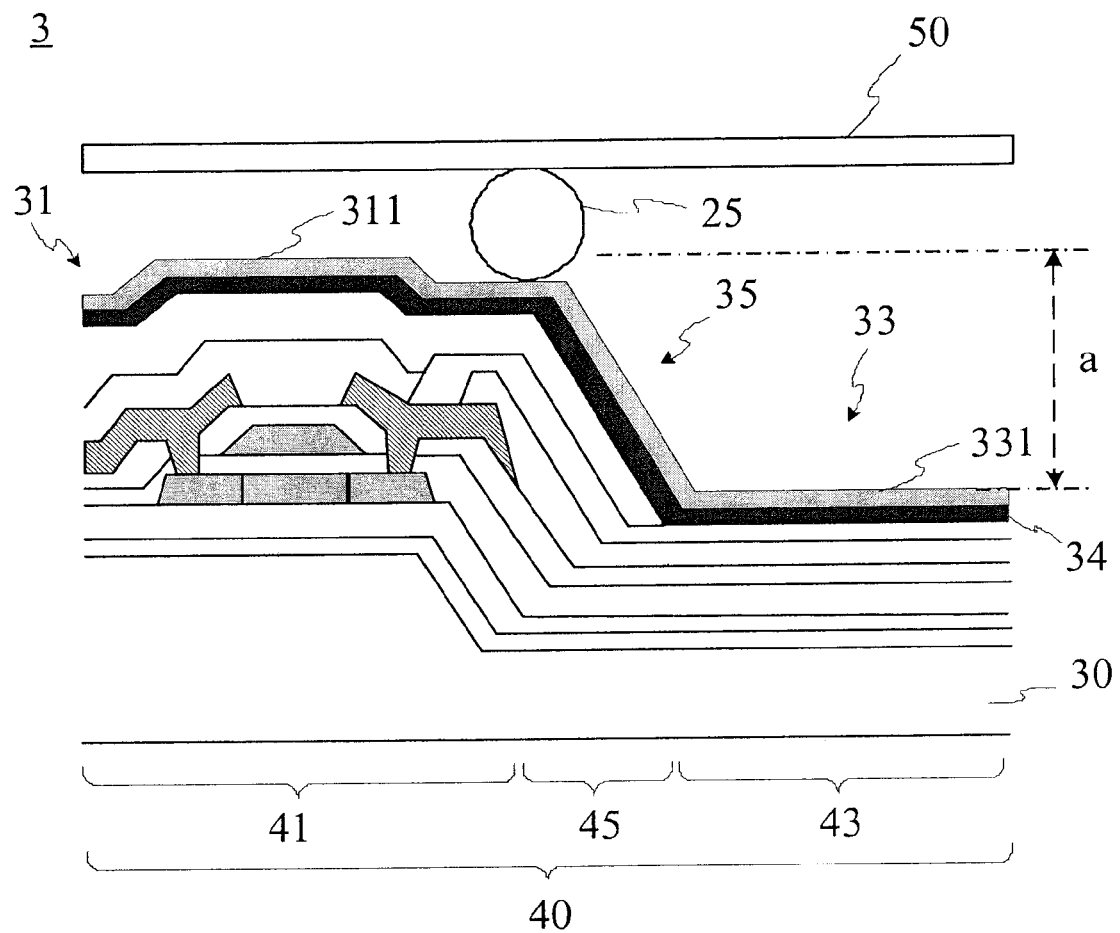
FIG. 3 is a cross-sectional view illustrating each pixel area of the first embodiment of the present invention.

With reference to FIG. 3, an organic electroluminescence structure 3 of the present invention comprises a first substrate 30, at least one control device 31, and an organic electroluminescence device 33. The first substrate 30 has a plurality of pixel areas. It is noted that only one pixel area 40 is illustrated in the figures for disclosing the present invention with clarity. The pixel area 40 includes a non-luminescence portion 41 and a luminescence portion 43, in which the non-luminescence portion 41 is adjacent to the luminescence portion 43. Moreover, the pixel area 40 further includes a connecting portion 45 for connecting the non-luminescence portion 41 and the luminescence portion 43.

Specifically, the control device 31 is disposed on the non-luminescence portion 41 while the organic electroluminescence device 33 is disposed on the luminescence portion 43, and the control device 31 electrically connected to the organic electroluminescence device 33. Referring to the figures, a connecting device 35 is disposed on the connecting portion 45 for connecting the organic electroluminescence device 33 and the control device 31.

It is noted that the control device 31 comprises a TFT, preferably. The embodiments of the present invention exemplify, but are not limited to, a top-gate type poly-silicon. The present invention can also be applied to a bottom-gate type or a dual gate type, which can be formed by poly-silicon, single crystal silicon, microcrystalline silicon, amorphous silicon, or the combination thereof. It can further applied to N-type, P-type, or the combination thereof. The organic electroluminescence device comprises an organic light emitting diode (OLED) or a polymer light emitting diode (PLED). In addition, the organic electroluminescence device can include, but not be limited to, a bottom emitting type, a top emitting type, or a dual emitting type.

In this embodiment, an upper surface 311 of the control device 31 and an upper surface 331 of the organic electroluminescence device 33 form a height difference a greater than or equal to about 2 micro meters. More specifically, after an evaporation process, the mask will be removed and a second substrate 50 (as above-mentioned, namely a cover substrate) will be subsequently disposed thereon. Generally, a passivation layer (not shown in figures) covers the control device 31 and the organic electroluminescence device 33. The height difference between the upper surfaces of the devices is greater than or equal to about 2 micro meters.

Figure 2:
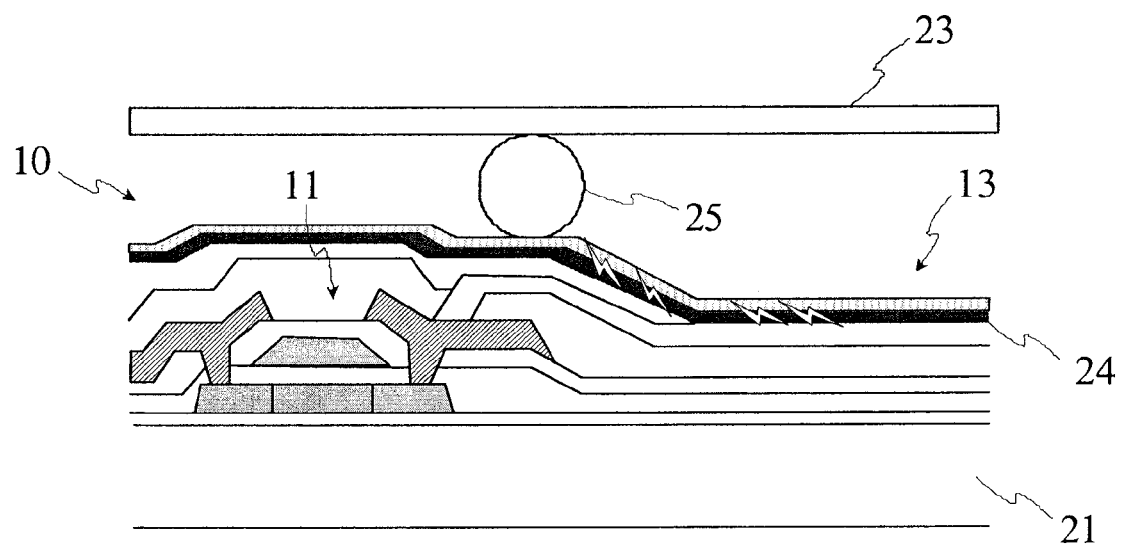
FIG. 2 is a cross-sectional view illustrating each pixel area in FIG. 1.
Figure 4:
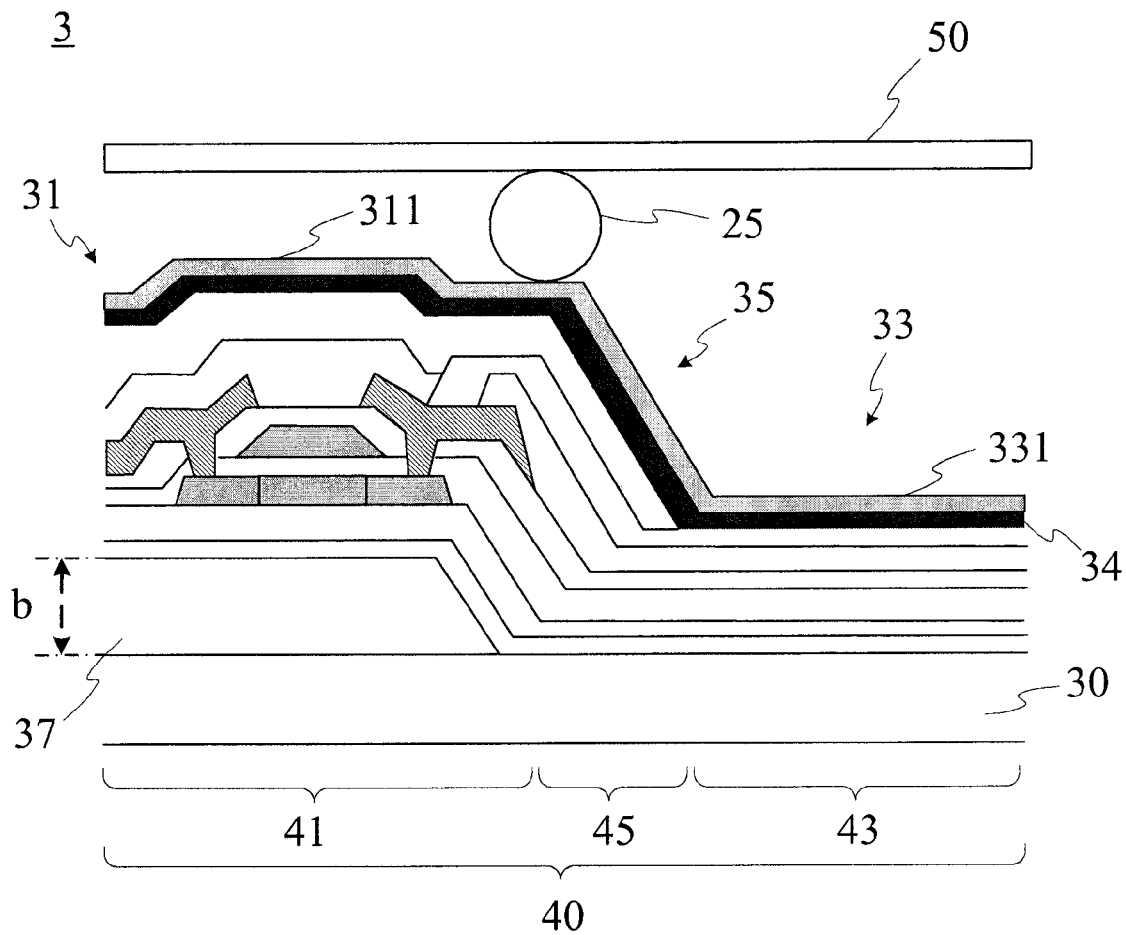
FIG. 4 is a cross-sectional view illustrating each pixel area of the second embodiment of the present invention.

The second embodiment of the present invention is shown in FIG. 4, which is another practical embodiment as shown in FIG. 3. The organic electroluminescence structure 3 further comprises a lifting layer 37 disposed between the control device 31 and the non-luminescence portion 41 of the first substrate 30. The lifting layer 37 has a thickness b preferably greater than about 0.5 micro meters. The thickness b can associate with the aforesaid height difference between the control device 31 and the organic electroluminescence device 33, as shown in FIG. 2, to get a total of height difference between the upper surface 311 of the control device 31 and the upper surface 331 of the organic electroluminescence device 33 to correspond to the predetermined height difference a, which is greater than or equal to about 2 micro meters. The aforementioned lifting layer 37 can comprise organic material, inorganic material, opaque material, light-penetrable material, or combinations thereof.

Figure 5:
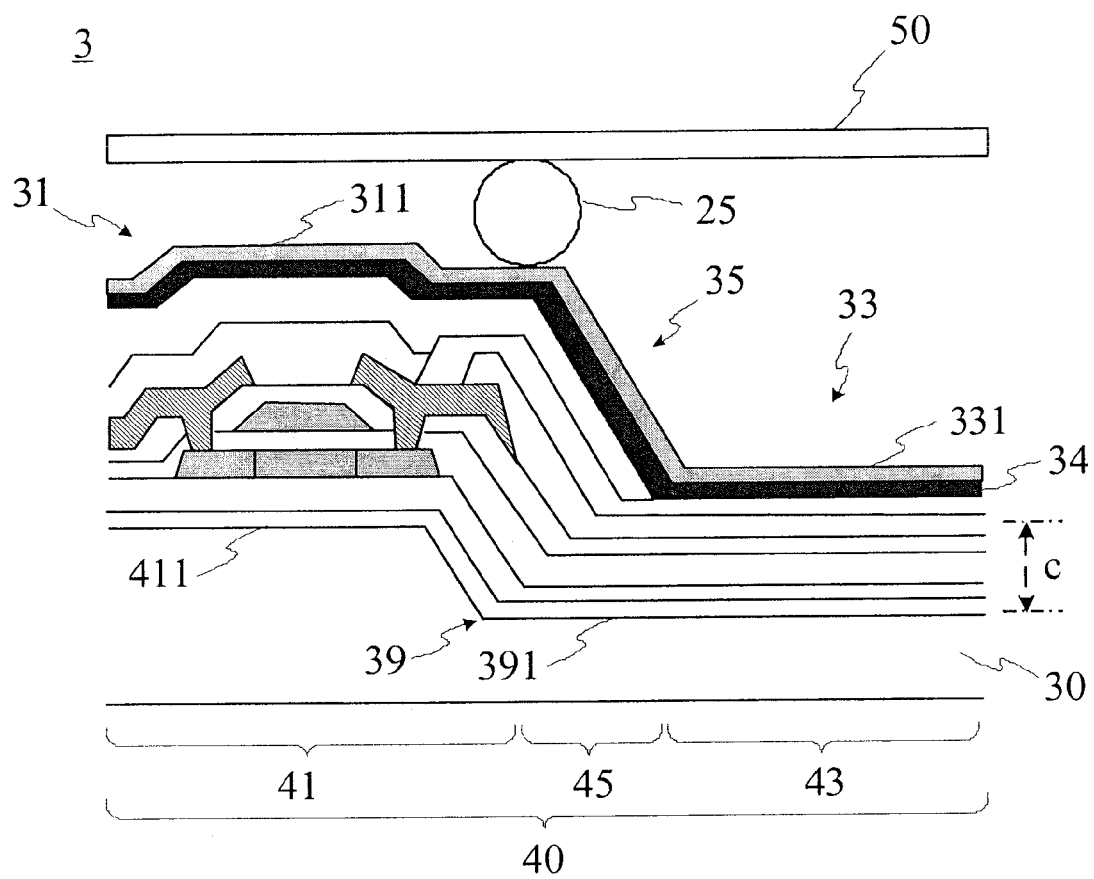
FIG. 5 is a cross-sectional view illustrating each pixel area of the third embodiment of the present invention.

The third embodiment of the present invention is shown in FIG. 5, which is another practical embodiment as shown in FIG. 3. The luminescence portion 43 of the organic electroluminescence structure 3 is formed with a recess 39 which has an upper surface 391. Also, the non-luminescence portion 41 defines an upper surface 411. The upper surface 391 of the recess 39 and the upper surface 411 of the non-luminescence portion 41 form a height difference c of about 0.1 micro meters to about 100 micro meters. The thickness c can associate with the aforesaid height difference between the control device 31 and the organic electroluminescence device 33, as shown in FIG. 2, to get a total of the height difference between the upper surface 311 of the control device 31 and the upper surface 331 of the organic electroluminescence device 33 to correspond to the predetermined height difference a, which is greater than or equal to about 2 micro meters.

It is understandable that the recess 39 disposed on the luminescence portion 43 in the aforesaid third embodiment can simultaneously be combined with the lifting layer 37 disposed on the non-luminescence portion 41 in the second embodiment, to form the predetermined height difference between the control device 31 on the non-luminescence portion 41 and the organic electroluminescence device 33 on the luminescence portion 43.

The above-mentioned recess and the lifting layer can be applied as desired but is not limited to the ways of the above disclosures. Any arrangement applicable to the present invention for achieving the similar effects is acceptable. For example, a predetermined expanded recess on all of the pixel areas 40 of the first substrate 30 can be formed in advance of starting the manufacturing processes. Soon after, the lifting layer 37 described in the second embodiment is applied to meet the needs of the height difference a.

Figure 1:
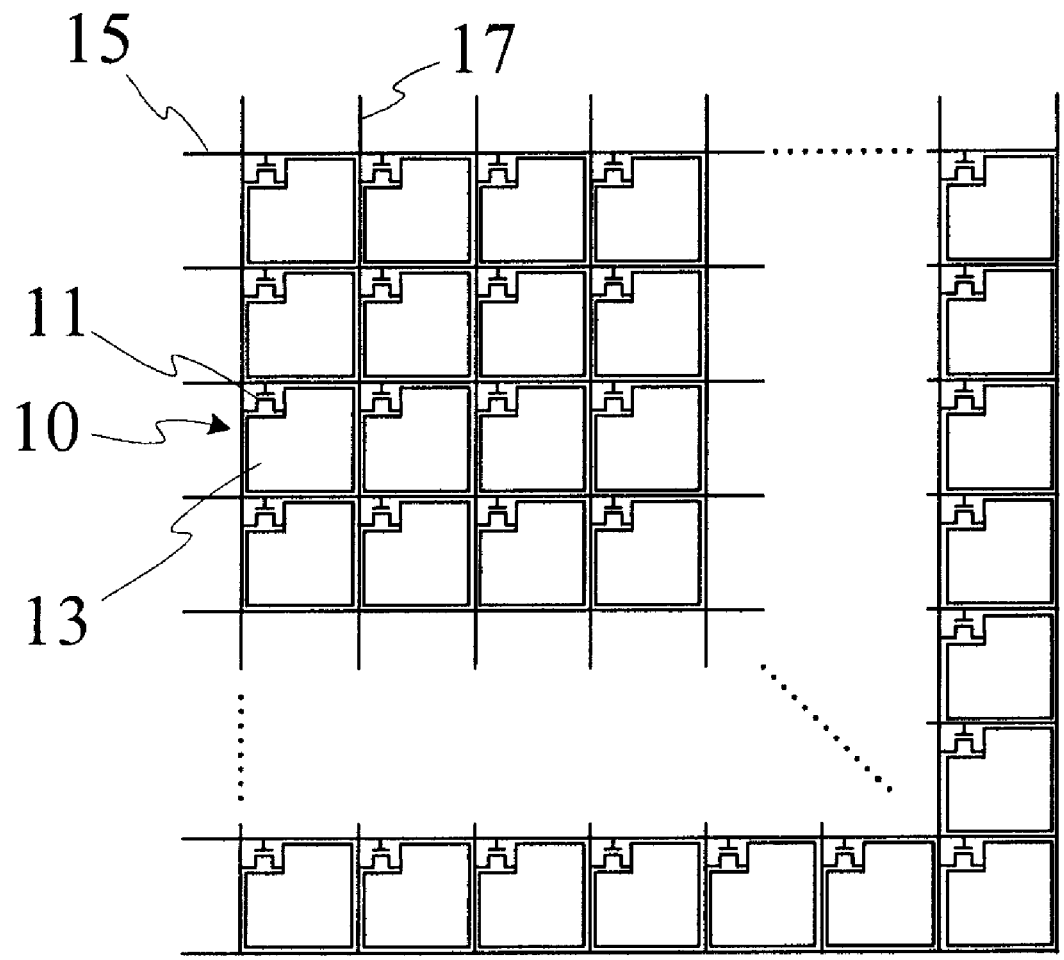
FIG. 1 is a plan view schematically illustrating a conventional OELD structure.

The aforementioned organic electroluminescence structure 3 can further comprise a signal line disposed on the non-luminescence portion 41. More specifically, the signal line electrically connects to the control device 31. With reference to FIG. 1, the signal line is formed by a plurality of scan lines 15 and data lines 17. Thereby, the display signals are transferred to each control device 31 of the organic electroluminescence structure 3 and then drive the organic electroluminescence device 33 to operate on the luminescence portion 43 for luminescence.

Figure 6:
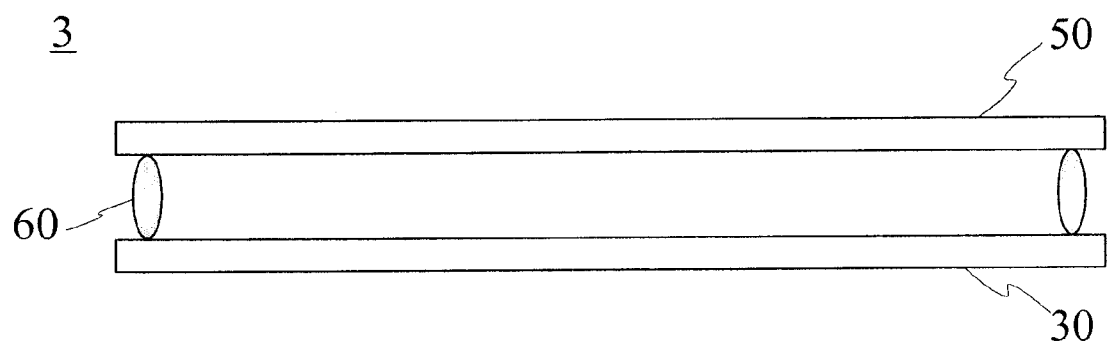
FIG. 6 is a schematic view illustrating the OELD display of the present invention after an encapsulation process.

In the following encapsulation process, the above-mentioned organic electroluminescence structure 3 is assembled with a second substrate 50 which is opposite to the first substrate 30. As shown in FIG. 6, sealants 60 are circumferentially applied between the first substrate 30 and the second substrate 50. Furthermore, the second substrate 50 can protect the organic electroluminescence device 33 from ambient influence. It can further include other components such as a desiccant, water absorbent, oxygen absorbent layer, or the like, to enhance its reliability. Moreover, the second substrate 50 can be combined with other components such as the organic electroluminescence device 33 (to form a dual display), a color filter or color transformation layer (to form a multicolor display), a reflecting layer (to form a reflecting display), or a transflective layer (to form a transflective display).

In the present invention, the connecting device 35, which is disposed on the connecting portion 45 of the pixel area 40 of the first substrate, forms a path (i.e. the sloping surface as shown in the figures). The specifically large height difference a between the upper surface 311 of the control device 31 and the upper surface 331 of the organic electroluminescence device 33 creates the sloping surface to have a longer path. When the upper surface 311 of the control device 31 is stressed by the undesired particle 25 during the manufacturing process, the OELD layer 34 of the organic electroluminescence device 33 can have a better buffer on the connecting device 35 because it acquires a longer path that makes it difficult for the stress to transit into the luminescence portion 43. In specific, even if the upper surface 311 of the control device 31 is subject to the sandwiched particle 25 and any damages due to stress are produced, the damages may not laterally diffuse to the luminescence portion 43. Thus, the display capability on the luminescence portion and the overall display quality can be maintained.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. An organic electroluminescence structure, comprising:
   a first substrate having a plurality of pixel areas, each of the pixel areas including a luminescence portion and a non-luminescence portion adjacent to the luminescence portion, wherein the first substrate is directly formed with a height difference structure so that an upper surface of the non-luminescence portion is higher than an upper surface of the luminescence portion;
   an organic electroluminescence device disposed on the luminescence portion; and
   at least one control device disposed on the non-luminescence portion and electrically connected to the organic electroluminescence device;
   wherein an upper surface of the control device and an upper surface of the organic electroluminescence device form a height difference greater than or equal to about 2 micro meters.

2. The structure of claim 1, wherein the pixel area of the first substrate has a recess located at the luminescence portion.

3. The structure of claim 1, wherein the pixel area of the first substrate has a recess located at both the luminescence portion and the non-luminescence portion.

4. The structure of claim 1, further comprising a lifting layer disposed on the non-luminescence portion of the pixel area of the first substrate.

5. The structure of claim 2, further comprising a lifting layer disposed on the non-luminescence portion of the pixel area of the first substrate.

6. The structure of claim 3, further comprising a lifting layer disposed on the non-luminescence portion of the pixel area of the first substrate.

7. The structure of claim 4, wherein the lifting layer comprises organic material, inorganic material, light-penetrable material, opaque material, or combinations thereof.

8. The structure of claim 2, wherein the recess has a depth ranging from about 0.1 micro meters to about 100 micro meters.

9. The structure of claim 4, wherein the lifting layer has a thickness greater than about 0.5 micro meters.

10. The structure of claim 1, wherein each of the pixel areas includes a connecting portion for connecting the luminescence portion and the non-luminescence portion.

11. The structure of claim 10, further comprising a connecting device, disposed on the connecting portion of the pixel area of the first substrate, for connecting the organic electroluminescence device and the control device.

12. The structure of claim 1, further comprising a signal line disposed on the non-luminescence portion.

13. The structure of claim 1, further comprising a second substrate disposed opposite to the first substrate, and a sealant disposed between the first and second substrates so as to assemble the first and second substrates.

14. An organic electroluminescence structure, comprising:
    a first substrate having a plurality of pixel areas, each of the pixel areas including a luminescence portion and a non-luminescence portion adjacent to the luminescence portion, wherein the first substrate is directly formed with a height difference structure so that an upper surface of the non-luminescence portion is higher than an upper surface of the luminescence portion;
    an organic electroluminescence device disposed on the luminescence portion; and
    at least one control device disposed on the non-luminescence portion and electrically connected to the organic electroluminescence device;
    wherein the height difference structure includes a recess being formed at the luminescence portion, and the upper surface of the luminescence portion and the upper surface of the non-luminescence portion form a height difference of about 0.1 micro meters to about 100 micro meters.

15. The structure of claim 14, wherein each of the pixel areas includes a connecting portion for connecting the luminescence portion and the non-luminescence portion.

16. The structure of claim 15, further comprising a connecting device, disposed on the connecting portion of the pixel area of the first substrate, for connecting the organic electroluminescence device and the control device.

17. The structure of claim 14, further comprising a second substrate disposed opposite to the first substrate, and a sealant disposed between the first and second substrates so as to assemble the first and second substrates.

18. The structure of claim 14, further comprising a lifting layer disposed on the non-luminescence portion of the pixel area of the first substrate.

19. The structure of claim 18, wherein the lifting layer comprises organic material, inorganic material, light-penetrable material, opaque material, or combinations thereof.

20. The structure of claim 18, wherein the lifting layer has a thickness greater than about 0.5 micro meters.

21. The structure of claim 14, further comprising a signal line disposed on the non-luminescence portion.

22. An organic electroluminescence structure, comprising:
    a first substrate having a plurality of pixel areas, each of the pixel areas including a luminescence portion and a non-luminescence portion adjacent to the luminescence portion;
    an organic electroluminescence device disposed on the luminescence portion;
    at least one control device disposed on the non-luminescence portion and electrically connected to the organic electroluminescence device; and
    a height difference structure being directly formed on the first substrate, wherein the height difference structure includes a lifting layer being disposed between the control device and the non-luminescence portion and having a thickness greater than about 0.5 micro meters.

23. The structure of claim 22, wherein each of the pixel areas includes a connecting portion for connecting the luminescence portion and the non-luminescence portion.

24. The structure of claim 23, further comprising a connecting device, disposed on the connecting portion of the pixel area of the first substrate, for connecting the organic electroluminescence device and the control device.

25. The structure of claim 22, further comprising a second substrate disposed opposite to the first substrate, and a sealant disposed between the first and second substrates so as to assemble the first and second substrates.

26. The structure of claim 22, wherein the luminescence portion is formed with a recess.

27. The structure of claim 26, wherein the recess has a depth ranging from about 0.1 micro meters to about 100 micro meters.

28. The structure of claim 22, wherein the lifting layer comprises organic material, inorganic material, light-penetrable material, opaque material, or combinations thereof.

29. The structure of claim 22, further comprising a signal line disposed on the non-luminescence portion.

* * * * *